(12) United States Patent
Lee et al.

(10) Patent No.: US 7,928,512 B2
(45) Date of Patent: Apr. 19, 2011

(54) SEMICONDUCTOR DEVICE

(75) Inventors: Kun-Hsien Lee, Tainan (TW);
Cheng-Tung Huang, Kaohsiung (TW);
Wen-Han Hung, Kaohsiung (TW);
Shyh-Fann Ting, Kaohsiung County (TW); Li-Shian Jeng, Taitung (TW);
Tzyy-Ming Cheng, Hsinchu (TW);
Chia-Wen Lang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 11/776,562

(22) Filed: Jul. 12, 2007

(65) Prior Publication Data
US 2007/0252218 A1 Nov. 1, 2007

Related U.S. Application Data

(62) Division of application No. 11/308,560, filed on Apr. 7, 2006, now Pat. No. 7,485,517.

(51) Int. Cl.
*H01L 27/12* (2006.01)

(52) U.S. Cl. ........ 257/365; 257/351; 257/371; 257/637; 257/638; 257/639; 257/E27.046

(58) Field of Classification Search .................. 257/365, 257/351, 371, 637, 638, 639, E27.046
See application file for complete search history.

(56) References Cited

U.S. PATENT DOCUMENTS

| 7,187,038 B2 * | 3/2007 | Morin et al. .................. 257/369 |
| 7,378,318 B2 * | 5/2008 | Runyon et al. ................ 438/275 |
| 2006/0226490 A1 * | 10/2006 | Burnett et al. ................ 257/365 |

FOREIGN PATENT DOCUMENTS

CN 1449585 10/2003
\* cited by examiner

*Primary Examiner* — Samuel A Gebremariam
(74) *Attorney, Agent, or Firm* — WPAT, PC; Justin King

(57) ABSTRACT

A semiconductor device is provided herein, which includes a substrate having a first-type MOS transistor, an input/output (I/O) second-type MOS transistor, and a core second-type MOS transistor formed thereon. The semiconductor device further includes a first stress layer and a second stress layer. The first stress layer is disposed on the first-type MOS transistor, or on the first-type MOS transistor and the I/O second-type MOS transistor. The second stress layer is disposed on the core second-type MOS transistor.

5 Claims, 5 Drawing Sheets

SEMICONDUCTOR DEVICE

CROSS-REFERENCE TO RELATED APPLICATION

This is a divisional application of an application Ser. No. 11/308,560, filed Apr. 7, 2006, now pending. The entirety of the above-mentioned patent application is hereby incorporated by reference herein and made a part of this specification.

BACKGROUND OF THE INVENTION

1. Field of the Invention

The present invention relates to an integrated circuit component and a method for fabricating the same, and more particularly, to a semiconductor device and a method for fabricating the same.

2. Description of the Related Art

In the development of the integrated circuit components, high speed and low power electricity consumption are achieved by reducing the size of the component. However, the technique of reducing the component size is limited by the fabrication technique and high cost, thus a new technique of reducing the component size is desired to improve the device driving current. Accordingly, a method of using the stress control had been proposed to overcome the limitation of reducing the component size.

In a conventional method of using the stress control for improving the device performance, a high tensile or high compression silicon nitride layer used as a contact etching stop layer (CESL) is selectively formed on the substrate according to the N-channel or P-channel to improve the device driving current.

However, the method of improving the device performance by using the stress layer still leave some problems. In general, a compressive stress layer is formed on the P-channel device to improve the current gain and efficiency of the device. However, for some P-channel device, the device reliability is degraded. For example, if a compressive stress layer is formed on the input/output (I/O) P-channel MOS transistor (metallic oxide semiconductor field effect transistor), a threshold voltage (Vt) shift effect occurs, which would slow the negative bias temperature instability (NBTI), and further reduce the current gain and affect the device performance.

SUMMARY OF THE INVENTION

Therefore, it is an object of the present invention to provide a method for fabricating a semiconductor device. The fabricating method avoids the negative bias temperature instability (NBTI) degradation, which otherwise reduces the current gain and affects the device performance.

It is another object of the present invention to provide a semiconductor device that can avoid the negative bias temperature instability (NBTI) degradation, such that the device performance is improved.

The present invention provides a method for fabricating a semiconductor device. First, a substrate is provided, and a first-type MOS transistor, an input/output (I/O) second-type MOS transistor, and a core second-type MOS transistor are formed on the substrate. Then, a first stress layer is formed to overlay the substrate, the first-type MOS transistor, the I/O second-type MOS transistor, and the core second-type MOS transistor. Then, at least the first stress layer on the core second-type MOS transistor is removed to reserve at least the first stress layer on the first-type MOS transistor. Finally, a second stress layer is formed on the core second-type MOS transistor.

In accordance with a preferred embodiment of the present invention, the method further comprises forming a second stress layer on the I/O second-type MOS transistor on which the first stress layer is formed.

In accordance with the preferred embodiment of the present invention, if the first-type MOS transistor is an N-channel MOS (NMOS) transistor and the I/O second-type MOS transistor and the core second-type MOS transistor are P-channel MOS (PMOS) transistors, the first stress layer should be a tensile stress layer and the second stress layer should be a compressive stress layer.

In accordance with the preferred embodiment of the present invention, if the first-type MOS transistor is a P-channel MOS (PMOS) transistor and the I/O second-type MOS transistor and the core second-type MOS transistor are the N-channel MOS (NMOS) transistors, the first stress layer should be a compressive stress layer and the second stress layer should be a tensile stress layer.

In accordance with the preferred embodiment of the present invention, the first stress layer is made of a material such as silicon nitride.

In accordance with the preferred embodiment of the present invention, the second stress layer is made of a material such as silicon nitride.

The present invention further provides a semiconductor device. The semiconductor device comprises a substrate, a first stress layer, and a second stress layer. Wherein, the first-type MOS transistor, the I/O second-type MOS transistor, and the core second-type MOS transistor are formed on the substrate. The first stress layer is disposed on the first-type MOS transistor, the I/O second-type MOS transistor, or the core second-type MOS transistor. The second stress layer is disposed on the core second-type MOS transistor.

In accordance with the preferred embodiment of the present invention, the method further comprises disposing the second stress layer on the I/O second-type MOS transistor that overlays the first stress layer.

In accordance with the preferred embodiment of the present invention, if the first-type MOS transistor is an N-channel MOS (NMOS) transistor and the I/O second-type MOS transistor and the core second-type MOS transistor are P-channel MOS (PMOS) transistors, the first stress layer should be a tensile stress layer and the second stress layer should be a compressive stress layer.

In accordance with the preferred embodiment of the present invention, if the first-type MOS transistor is a P-channel MOS (PMOS) transistor and the I/O second-type MOS transistor and the core second-type MOS transistor are N-channel MOS (NMOS) transistors, the first stress layer should be a compressive stress layer and the second stress layer should be a tensile stress layer.

In accordance with the preferred embodiment of the present invention, the first stress layer is made of a material such as silicon nitride.

In accordance with the preferred embodiment of the present invention, the second stress layer is made of a material such as silicon nitride.

According to the present invention, a tensile stress layer, a tensile stress layer and a compressive stress layer, or nothing, is formed on the I/O second-type MOS transistor. When the negative bias is applied on the substrate, $H^+$ is not accumulated in the gate dielectric layer, thus the threshold voltage (Vt) shift effect does not occur. In other words, the negative bias temperature instability (NBTI) degradation in the conventional technique is effectively avoided. On the other hand, the method of the present invention does not increase the quantity of the photomasks used in the fabricating process, thus the present invention does not increase any additional fabricating cost.

BRIEF DESCRIPTION DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

FIG. 1A-1D are cross-sectional views illustrating a method for fabricating a semiconductor device according to an embodiment of the present invention.

Figure 1A:
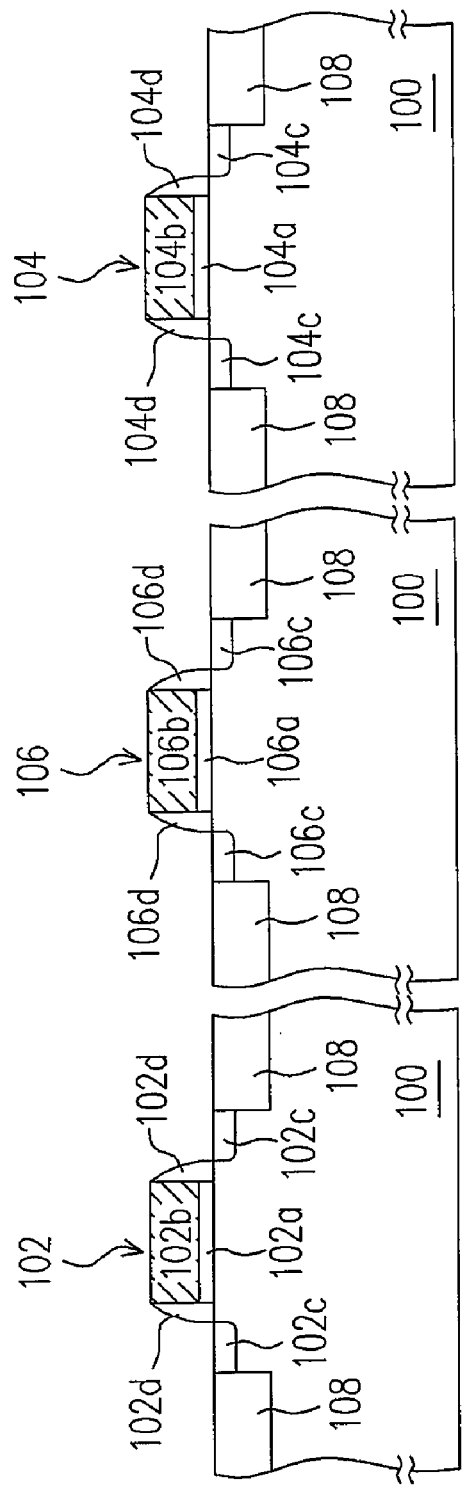
FIG. 1A-1D are cross-sectional views illustrating a method for fabricating a semiconductor device according to an embodiment of the present invention.

First, referring to FIG. 1A, a substrate 100 is provided. A first-type MOS transistor 102, an input/output (I/O) second-type MOS transistor 104, and a core second-type MOS transistor 106 are formed on the substrate 100. In addition, the first-type MOS transistor 102, the I/O second-type MOS transistor 104, and the core second-type MOS transistor 106 are separated from each other by an isolation structure 108. Here, the isolation structure 108 may be a shallow trench isolation (STI) structure.

The I/O second-type MOS transistor 104 is an input/output (I/O) MOS transistor, and the core second-type MOS transistor is a core MOS transistor. Wherein, the F first-type MOS transistor 102 may be an N-channel MOS (NMOS) transistor, and the I/O second-type MOS transistor 104 and the core second-type MOS transistor 106 may be P-channel MOS (PMOS) transistors. The first-type MOS transistor 102 comprises a gate dielectric layer 102a, a polysilicon layer 102b, a source/drain region 102c, and a spacer 102d. The I/O second-type MOS transistor 104 comprises a gate dielectric layer 104a, a polysilicon layer 104b, a source/drain region 104c, and a spacer 104d. The core second-type MOS transistor 106 comprises a gate dielectric layer 106a, a polysilicon layer 106b, a source/drain region 106c, and a spacer 106d.

In an embodiment, a metal silicide layer (not shown) is formed on the polysilicon layers 102b, 104b, 106b and the source/drain regions 102c, 104c, 106c to reduce the resistance, and the metal silicide layer is made of NiSi, WSi or CoSi. In another embodiment, a silicon oxide spacer (not shown) is formed on the sidewalls of the polysilicon layers 102b, 104b, 106b based on the fabrication requirement.

The material and forming method of the first-type MOS transistor 102, the I/O second-type MOS transistor 104, and the core second-type MOS transistor 106 are known to one of the ordinary skills in the art, thus its detail is omitted herein.

Figure 1B:
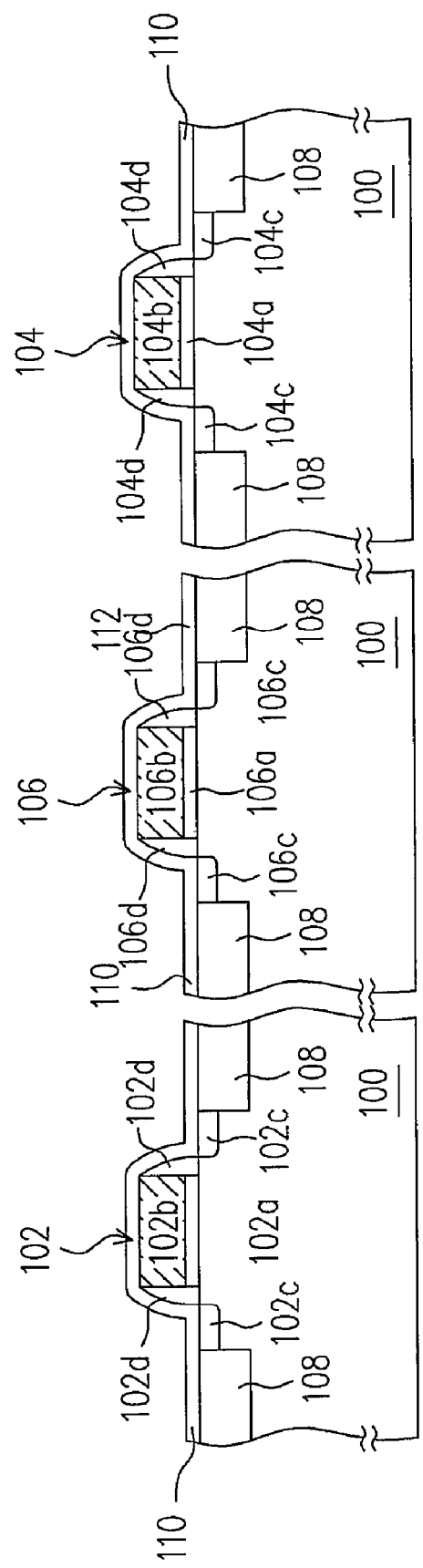

Then, referring to FIG. 1B, a first stress layer 110 is formed on the substrate 100 to overlay the substrate 100, the first-type MOS transistor 102, the I/O second-type MOS transistor 104, and the core second-type MOS transistor 106. Here, the first stress layer 110 is a tensile stress layer that is made of a material such as silicon nitride or other appropriate dielectric layer and formed by a plasma-enhanced chemical vapor deposition (PECVD) method or other appropriate method.

Figure 1C:
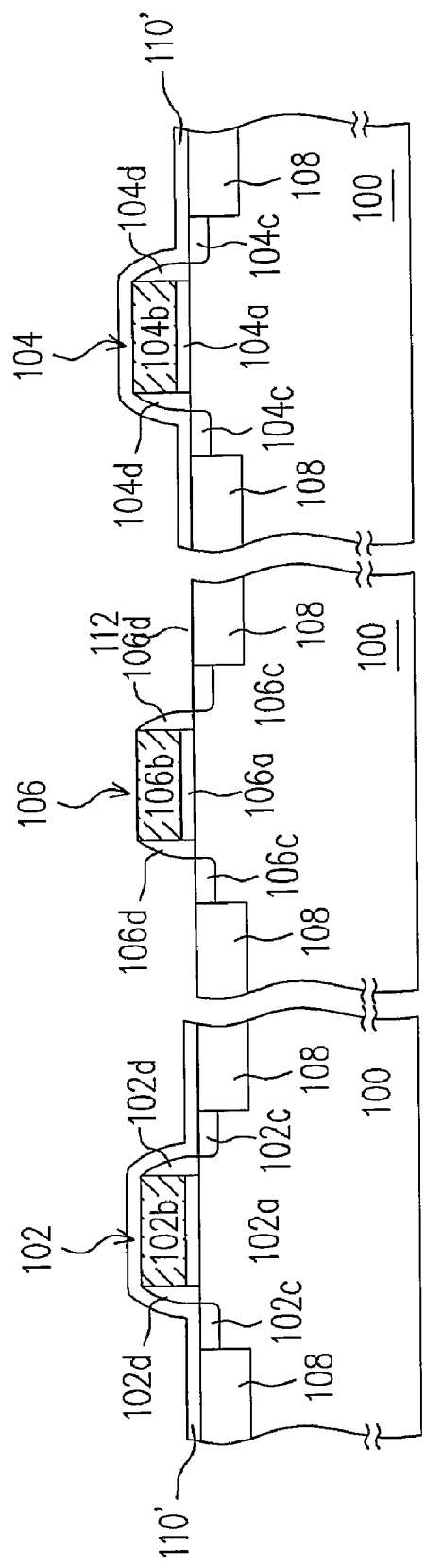

Then, referring to FIG. 1C, the first stress layer 110 on the core second-type MOS transistor 106 is removed to form a first stress layer 110'. The method for removing the first stress layer 110 on the core second-type MOS transistor 106 comprises: forming a patterned photomask layer (not shown) on the first stress layer 110 to expose the first stress layer 110 on the core second-type MOS transistor 106; and performing an etching process to remove the first stress layer 110 that is not overlaid by the patterned photomask layer to form the first stress layer 110'.

Figure 1D:
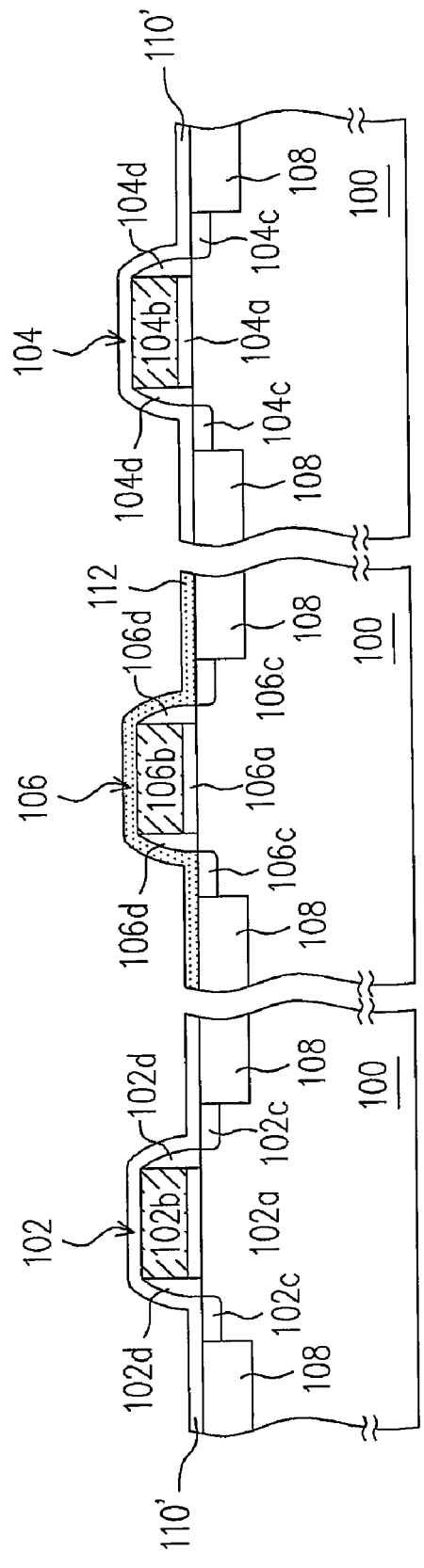

Then, referring to FIG. 1D, a second stress layer 112 is formed on the core second-type MOS transistor 106. Here, the second stress layer 112 is a compressive stress layer that is made of a material such as silicon nitride or other appropriate dielectric layer. The method for forming the second stress layer 112 comprises: forming a stress material layer (not shown) on the first stress layer 110' and the core second-type MOS transistor 106 by using a plasma-enhanced chemical vapor deposition (PECVD) method or other appropriate method; forming a patterned photomask layer (not shown) on the stress material layer to expose the first stress layer 110' on the first-type MOS transistor 102 and the I/O second-type MOS transistor 104; and using the patterned photomask as a mask to perform an etching process in order to remove the stress material layer on the first stress layer 110', such that the second stress layer 112 is formed.

In summary, in the present invention, a tensile stress layer is formed on the I/O second-type MOS transistor (i.e. the I/O MOS transistor). Thus, when the negative bias is applied on the substrate, the Si—H link in the stress layer is broken, and H⁺ is moving out of the tensile stress layer and not accumulated in the gate dielectric layer, thus the threshold voltage (Vt) shift effect does not occur. In other words, the negative bias temperature instability (NBTI) degradation does not occur anymore.

Figure 2:
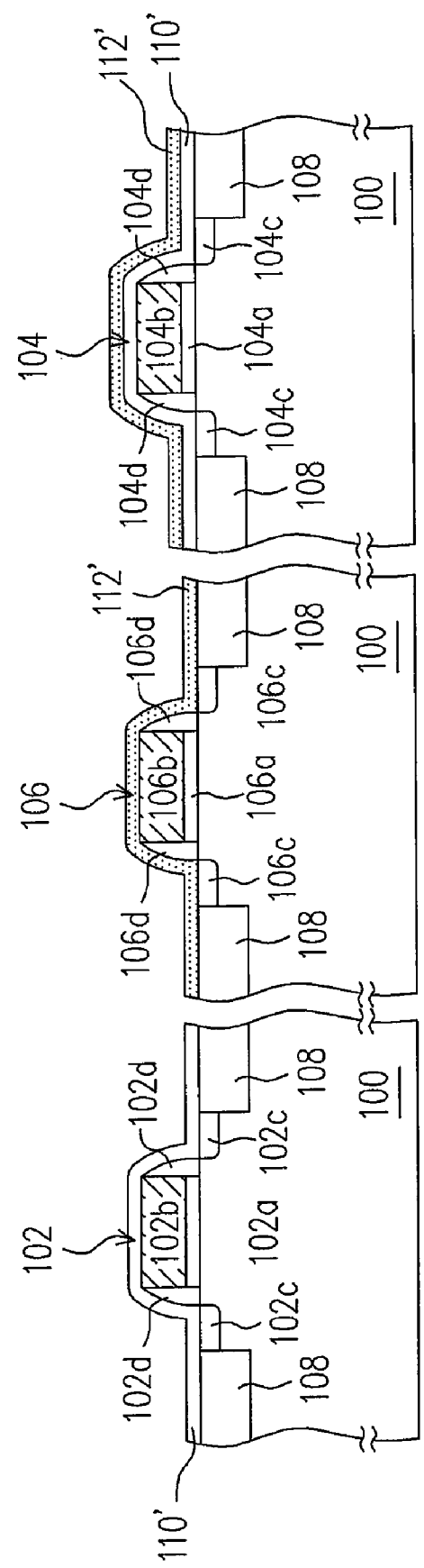
FIG. 2 is a cross-sectional view illustrating a method for fabricating a semiconductor device according to another embodiment of the present invention.

In addition to the embodiments mentioned above, the present invention may be implemented in different ways. FIG. 2 is a cross-sectional view illustrating a method for fabricating a semiconductor device according to another embodiment of the present invention. The method described in FIG. 2 is performed subsequent to the embodiment in FIG. 1C. The same reference numbers are used in FIGS. 1A, 1B and 2, and its detail is omitted herein.

Referring to FIG. 2, after the first stress layer 110' is formed, a second stress layer 112' is formed on the I/O second-type MOS transistor 104 and the core second-type MOS transistor 106. Here, the second stress layer 112' is a compressive stress layer that is made of a material such as silicon nitride or other appropriate dielectric layer. The method for forming the second stress layer 112' comprises: forming a stress material layer (not shown) on the first stress layer 110' and the core second-type MOS transistor 106 by using a plasma-enhanced chemical vapor deposition (PECVD) method or other appropriate method; forming a patterned photomask layer (not shown) on the stress material layer to expose the first stress layer 110' on the first-type MOS transistor 102; and using the patterned photomask as a mask to perform an etching process in order to remove part of the stress material layer, such that the second stress layer 112' is formed.

Figure 3A:
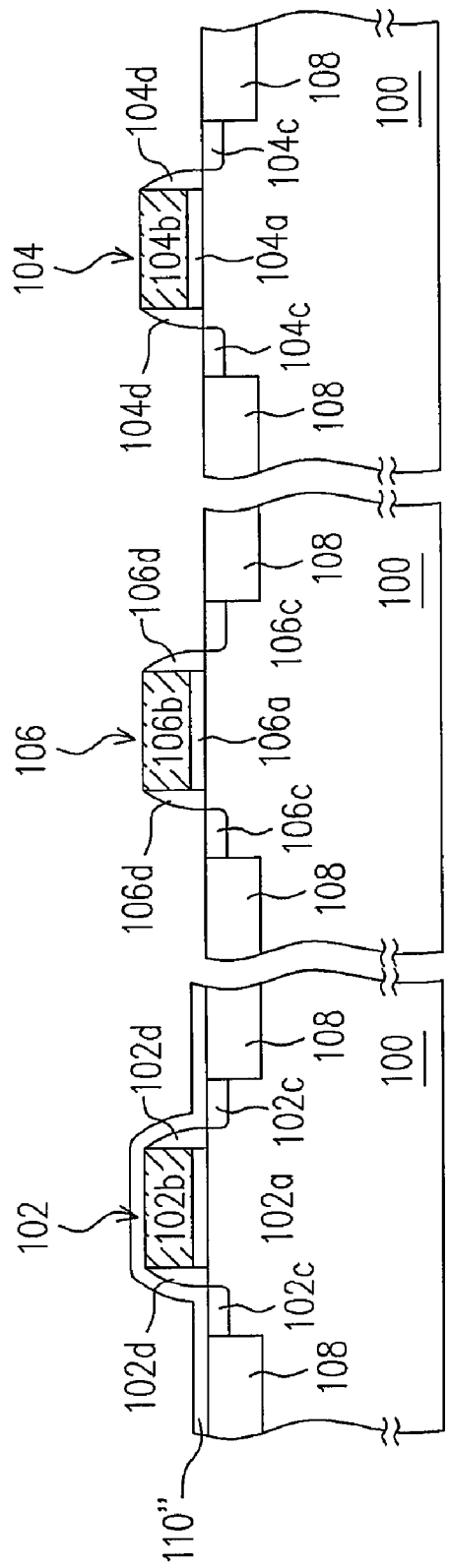
FIG. 3A-3B are the cross-sectional views illustrating a method for fabricating a semiconductor device according to yet another embodiment of the present invention.
Figure 3B:
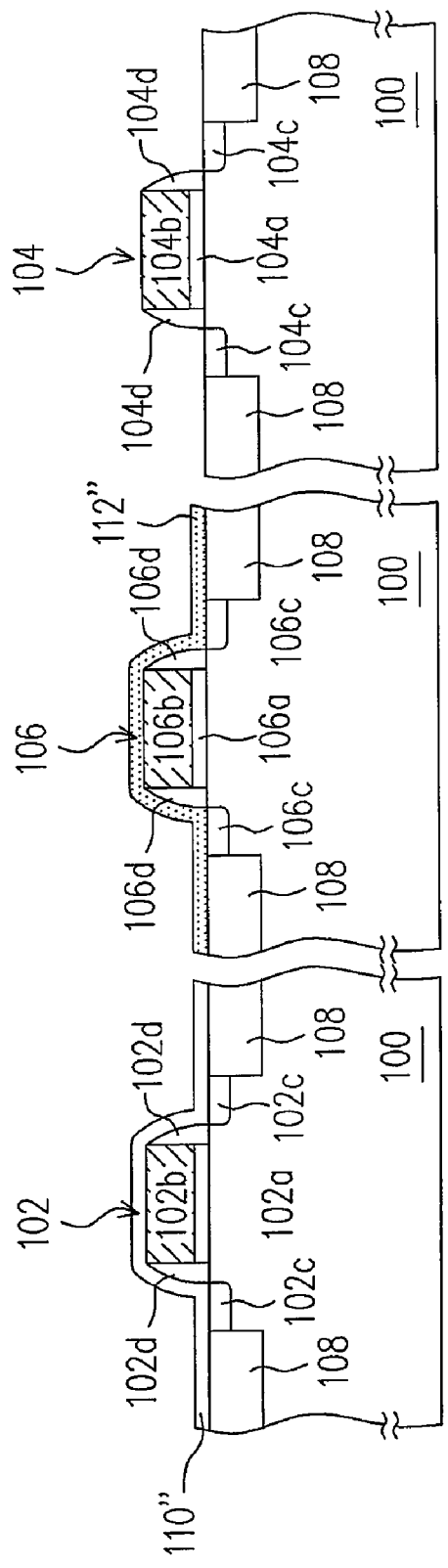

FIG. 3A-3B are cross-sectional views illustrating a method for fabricating a semiconductor device according to yet another embodiment of the present invention. The method described in FIG. 3A is performed subsequent to the embodiment in FIG. 1B. The same reference numbers are used in FIGS. 3A, 3B, 1A and 1B, and its detail is omitted herein.

Referring to FIG. 3A, after the first stress layer 110 is formed, the first stress layer 110 on the core second-type MOS transistor 106 and the I/O second-type MOS transistor 104 is removed to form a first stress layer 110". The method for removing the first stress layer 110 on the core second-type MOS transistor 106 and the I/O second-type MOS transistor 104 comprises: forming a patterned photomask layer (not shown) on the first stress layer 110 to expose the first stress layer 110 on the core second-type MOS transistor 106 and the I/O second-type MOS transistor 104; and performing an etching process to remove the first stress layer 110 that is not overlaid by the patterned photomask layer to form the first stress layer 110".

Then, referring to FIG. 3B, a second stress layer 112" is formed on the I/O second-type MOS transistor 104 and the core second-type MOS transistor 106. Here, the second stress layer 112" is a compressive stress layer that is made of a material such as silicon nitride or other appropriate dielectric layer. The method for forming the second stress layer 112" comprises: forming a stress material layer (not shown) on the first stress layer 110", the I/O second-type MOS transistor 104, and the core second-type MOS transistor 106 by using a plasma-enhanced chemical vapor deposition (PECVD) method or other appropriate method; forming a patterned photomask layer (not shown) on the stress material layer to expose the first stress layer 110" and the I/O second-type MOS transistor 104; and using the patterned photomask as a mask to perform an etching process in order to remove part of the stress material layer, such that the second stress layer 112" is formed.

Similarly, in the present invention, a tensile stress layer and a compressive stress layer, or nothing, is formed on the I/O second-type MOS transistor (i.e. the I/O MOS transistor). When the negative bias is applied on the substrate, $H^+$ is not accumulated in the gate dielectric layer, thus the threshold voltage (Vt) shift effect does not occur. In other words, the negative bias temperature instability (NBTI) degradation in the conventional technique is effectively avoided.

In the embodiments mentioned above, the first-type MOS transistor 102 is an N-channel MOS (NMOS) transistor, the I/O second-type MOS transistor 104 and the core second-type MOS transistor 106 are P-channel MOS (PMOS) transistors, the first stress layers 110, 110', 110" are tensile stress layers, and the second stress layers 112, 112', 112" are compressive stress layers. However, the transistors and the stress layers mentioned above only serve for describing the present invention and should not be limited thereto. In another embodiment, the first-type MOS transistor 102 is a P-channel MOS (PMOS) transistor, the I/O second-type MOS transistor 104 and the core second-type MOS transistor 106 are N-channel MOS (NMOS) transistors, the first stress layers 110, 110', 110" are compressive stress layers, and the second stress layers 112, 112', 112" are tensile stress layers.

A semiconductor device obtained by the method for fabricating the semiconductor device provided by the present invention is described in detail hereinafter.

Referring to FIG. 1D, the semiconductor device of the present invention comprises a substrate 100, a first stress layer 110', and a second stress layer 112. Wherein, a first-type MOS transistor 102, an I/O second-type MOS transistor 104, and a core second-type MOS transistor 106 are formed on the substrate. The first stress layer 110' is disposed on the first-type MOS transistor 102 and the I/O second-type MOS transistor 104, and the first stress layer 110' is made of a material such as silicon nitride or other appropriate dielectric layer. The second stress layer 112 is disposed on the core second-type MOS transistor 106, and the second stress layer 112 is made of a material such as silicon nitride or other appropriate dielectric layer.

In addition, referring to FIG. 2, the semiconductor device of the present invention comprises a substrate 100, a first stress layer 110', and a second stress layer 112'. Wherein, a first-type MOS transistor 102, an I/O second-type MOS transistor 104, and a core second-type MOS transistor 106 are formed on the substrate. The first stress layer 110' is disposed on the first-type MOS transistor 102 and the I/O second-type MOS transistor 104, and the first stress layer 110' is made of a material such as silicon nitride or other appropriate dielectric layer. The second stress layer 112' is disposed on the core second-type MOS transistor 106 and the I/O second-type MOS transistor 104 that overlays the first stress layer 110', and it is made of a material such as silicon nitride or other appropriate dielectric layer.

Moreover, referring to FIG. 3B, the semiconductor device of the present invention comprises a substrate 100, a first stress layer 110", and a second stress layer 112". Wherein, a first-type MOS transistor 102, an I/O second-type MOS transistor 104, and a core second-type MOS transistor 106 are formed on the substrate. The first stress layer 110" is disposed on the first-type MOS transistor 102 and made of a material such as silicon nitride or other appropriate dielectric layer. The second stress layer 112" is disposed on the core second-type MOS transistor 106 and made of a material such as silicon nitride or other appropriate dielectric layer.

Figure 4:
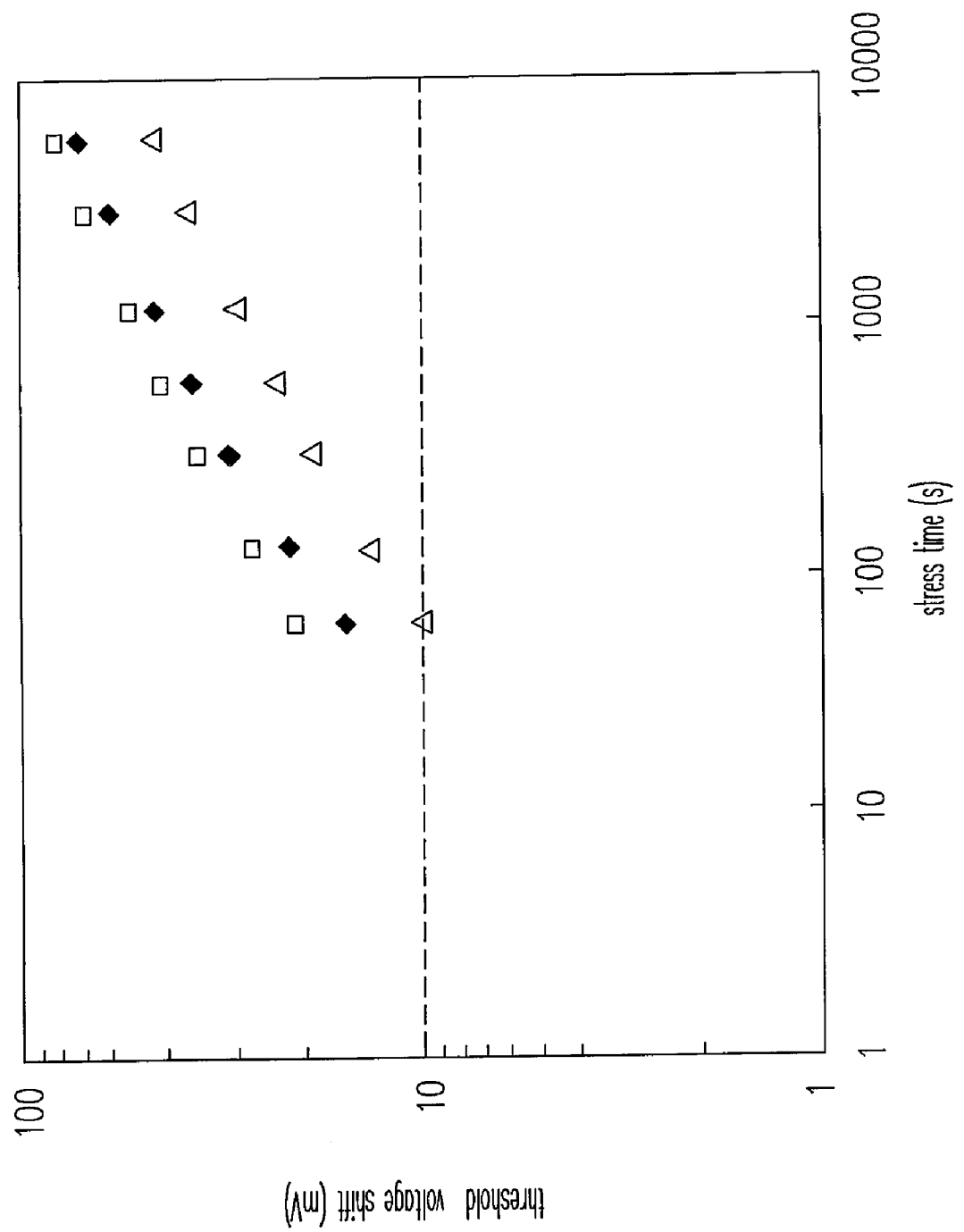
FIG. 4 is a diagram illustrating the relationship of the stress time and the threshold voltage shift amount of the semiconductor device in the present invention and in the conventional technique.

Please refer to FIG. 4 for verifying the effect of the present invention. FIG. 4 is a diagram illustrating the relationship of the stress time and the threshold voltage shift amount of the semiconductor device in the present invention and in the conventional technique.

Referring to FIG. 4, the objects to be tested in the diagram are: a semiconductor device on which a compressive stress layer is formed on an I/O second-type MOS transistor (represented by symbol □); a semiconductor device on which a low stress layer is formed on an I/O second-type MOS transistor (represented by symbol ◆); and a semiconductor device on which a tensile stress layer is formed on an I/O second-type MOS transistor (represented by symbol Δ). Under the constant voltage condition, the test is performed on the objects to obtain the threshold voltage shift amount (ΔVt) in response to the variance of the stress time. It is known from the relationship between the stress time and the threshold voltage shift amount, when the stress time gradually increases, the threshold voltage shift amount of the semiconductor device on which the low stress layer or the tensile stress layer is formed on the I/O second-type MOS transistor is less than that of the semiconductor device on which the compressive stress layer is formed on the I/O second-type MOS transistor. As a result, the semiconductor device of the present invention does not have the negative bias temperature instability (NBTI) degradation.

In summary, with the semiconductor device and the fabricating method thereof provided by the present invention, when the negative bias is applied on the substrate, $H^+$ is not accumulated in the gate dielectric layer, thus the threshold voltage (Vt) shift effect does not occur. In other words, the negative bias temperature instability (NBTI) degradation in the conventional technique is effectively avoided. On the other hand, compared with the conventional technique, the method of the present invention does not increase the quantity of the photomasks used in the fabricating process, thus the present invention does not increase any additional fabricating cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising: a substrate having a first-type MOS transistor with a first conductivity type, an input/output (I/O) second-type MOS transistor with a second conductivity type, and a core second-type MOS transistor with the second conductivity type formed thereon, wherein the first conductivity type is different from the second conductivity type; a first stress layer disposed on the first-type MOS transistor and the I/O second-type MOS transistor but not the core second-type MOS transistor; and a second stress layer only disposed on the core second-type MOS transistor and the I/O second-type MOS transistor, wherein the I/O second-type MOS transistor is overlaid by the first stress layer and the second stress layer is different from the first stress layer.

2. The semiconductor device of claim 1, wherein if the first-type MOS transistor is an N-channel MOS (NMOS) transistor and the I/O second-type MOS transistor and the core second-type MOS transistor are P-channel MOS (PMOS) transistors, the first stress layer is a tensile stress layer and the second stress layer is a compressive stress layer.

3. The semiconductor device of claim 1, wherein if the first-type MOS transistor is a P-channel MOS (PMOS) transistor and the I/O second-type MOS transistor and the core second-type MOS transistor are N-channel MOS (NMOS) transistors, the first stress layer is a compressive stress layer and the second stress layer is a tensile stress layer.

4. The semiconductor device of claim 1, wherein the first stress layer is made of a material comprising silicon nitride.

5. The semiconductor device of claim 1, wherein the second stress layer is made of a material comprising silicon nitride.

* * * * *